United States Patent
Ono et al.

(10) Patent No.: US 10,064,316 B2
(45) Date of Patent: Aug. 28, 2018

(54) VEHICULAR POWER CONVERSION DEVICE

(71) Applicant: Mitsubishi Electric Corporation, Chiyoda-ku, Tokyo (JP)

(72) Inventors: Yoshitaka Ono, Tokyo (JP); Yu Taketomi, Tokyo (JP); Akihiro Murahashi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/899,706

(22) PCT Filed: Jun. 20, 2013

(86) PCT No.: PCT/JP2013/066970
§ 371 (c)(1),
(2) Date: Dec. 18, 2015

(87) PCT Pub. No.: WO2014/203374
PCT Pub. Date: Dec. 24, 2014

(65) Prior Publication Data
US 2016/0143193 A1    May 19, 2016

(51) Int. Cl.
*H05K 7/20* (2006.01)
*H01L 23/467* (2006.01)
(Continued)

(52) U.S. Cl.
CPC ......... *H05K 7/20909* (2013.01); *B61C 17/00* (2013.01); *H01L 23/427* (2013.01);
(Continued)

(58) Field of Classification Search
CPC ................. H05K 7/20909; H05K 7/20; H05K 7/20845–7/20945; H05K 7/1432;
(Continued)

(56) References Cited

U.S. PATENT DOCUMENTS 6,902,020 B2 * 6/2005 Kronner ................. B60R 16/04
180/68.5
7,419,209 B1 * 9/2008 Mangiapane ...... B60H 1/00278
180/65.1
(Continued)

FOREIGN PATENT DOCUMENTS

CN    101547810 A    9/2009
JP    54-065908 A    5/1979
(Continued)

OTHER PUBLICATIONS

Office Action (Notification of Reasons for Rejection) dated Nov. 15, 2016, by the Japanese Patent Office in corresponding Japanese Patent Application No. 2015-522436 and partial English translation of the Office Action. (6 pages).
(Continued)

*Primary Examiner* — David M Sinclair
*Assistant Examiner* — Robert Brown
(74) *Attorney, Agent, or Firm* — Buchanan Ingersoll & Rooney PC

(57) ABSTRACT

A vehicular power conversion device is provided with a semiconductor that converts power. The power conversion device is provided with: coolers that are arranged in an array in a vehicle advancement direction and cool the semiconductor; and a cooler cover having the coolers located therein and provided with ventilation openings serving as an intake port and a discharge port for travel-generated airflow. A cavity serving as a passageway for the travel-generated airflow is provided in at least one of above, below, and to the side of the plurality of coolers inside the cooler cover. The ventilation openings are disposed in the vehicle advancement direction from the cavity. The airflow-receiving plate is located in the cavity and, when the travel-generated airflow flows from the ventilation opening into the cavity,
(Continued)

changes the direction of the incoming travel-generated airflow to a direction toward the coolers.

10 Claims, 14 Drawing Sheets

(51) Int. Cl.
    *H02M 7/00*     (2006.01)
    *B61C 17/00*     (2006.01)
    *H01L 23/427*     (2006.01)
    *H02M 7/48*     (2007.01)
    *H01L 23/367*     (2006.01)

(52) U.S. Cl.
    CPC ............ *H01L 23/467* (2013.01); *H02M 7/00* (2013.01); *H02M 7/003* (2013.01); *H02M 7/48* (2013.01); *H05K 7/20* (2013.01); *H05K 7/20854* (2013.01); *H05K 7/20918* (2013.01); *H05K 7/20936* (2013.01); *H01L 23/3672* (2013.01); *H01L 23/3677* (2013.01); *H01L 2924/0002* (2013.01)

(58) Field of Classification Search
    CPC ..... B61C 17/00; H01L 23/427; H01L 23/473; H02M 7/00; H01H 9/52
    See application file for complete search history.

(56) References Cited

U.S. PATENT DOCUMENTS

| | | | | |
|---|---|---|---|---|
| 8,174,833 | B2 * | 5/2012 | Kitanaka | B60L 9/16 361/710 |
| 2005/0011692 | A1 * | 1/2005 | Takahashi | B60R 16/04 180/68.5 |
| 2008/0296075 | A1 * | 12/2008 | Zhu | B60K 1/04 180/68.1 |
| 2009/0183935 | A1 * | 7/2009 | Tsuchiya | B60K 1/04 180/68.1 |
| 2009/0260905 | A1 * | 10/2009 | Shinmura | B60K 1/04 180/68.1 |
| 2010/0089675 | A1 * | 4/2010 | Nagata | B60K 1/04 180/68.5 |
| 2011/0188200 | A1 * | 8/2011 | Takahashi | B61C 17/00 361/690 |
| 2012/0050993 | A1 * | 3/2012 | Suzuki | H05K 7/20936 361/700 |
| 2012/0199316 | A1 * | 8/2012 | Maurer | F28F 13/06 165/44 |
| 2014/0156135 | A1 * | 6/2014 | Maki | G07C 5/008 701/29.1 |
| 2015/0016171 | A1 * | 1/2015 | Yasuda | B61C 17/00 363/141 |

FOREIGN PATENT DOCUMENTS

| | | |
|---|---|---|
| JP | 56-122677 | 9/1981 |
| JP | 10-297482 A | 11/1998 |
| JP | 2001-024124 A | 1/2001 |
| JP | 2006-306399 A | 11/2006 |
| JP | 2007-184464 A | 7/2007 |
| JP | 2011-042198 A | 3/2011 |

OTHER PUBLICATIONS

International Search Report (PCT/ISA/210) dated Sep. 24, 2013, by the Japanese Patent Office as the International Searching Authority for International Application No. PCT/JP2013/066970.

Written Opinion (PCT/ISA/237) dated Sep. 24, 2013, by the Japanese Patent Office as the International Searching Authority for International Application No. PCT/JP2013/066970.

Office Action (Notice of Reasons for Rejection) dated May 24, 2016 by the Japanese Patent Office in corresponding Japanese Patent Application No. 2015-522436, and an English translation thereof. (5 pgs).

First Office Action dated Jun. 5, 2017 in corresponding Chinese Patent Application No. 201380077588.4, and a partial English translation thereof (8 pages).

* cited by examiner

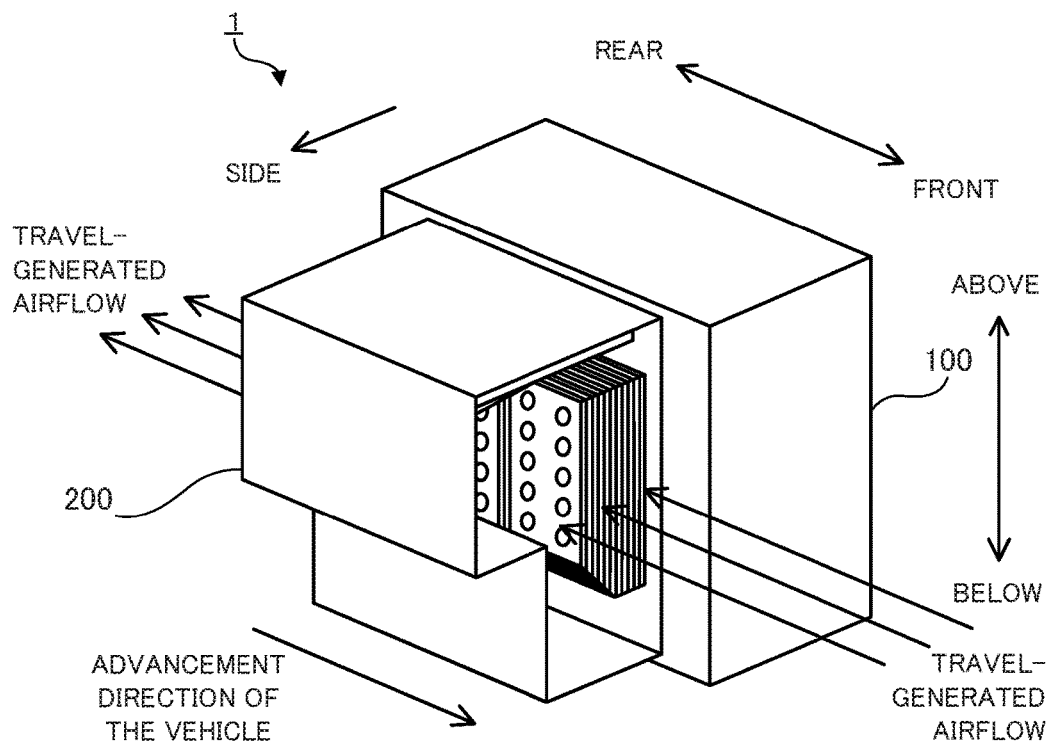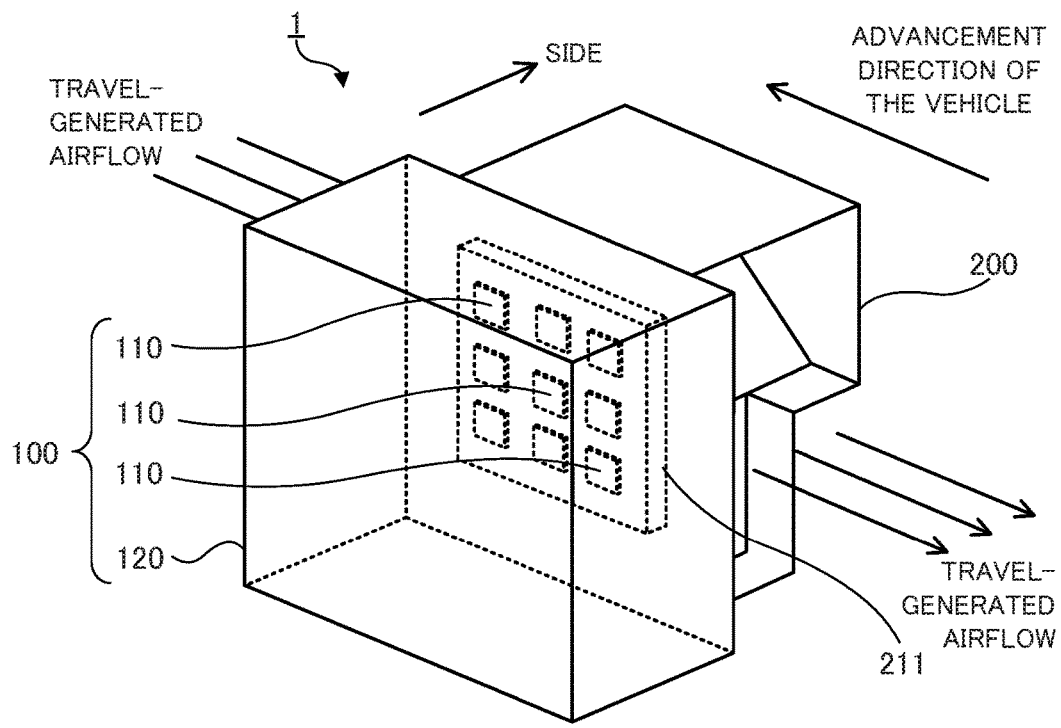

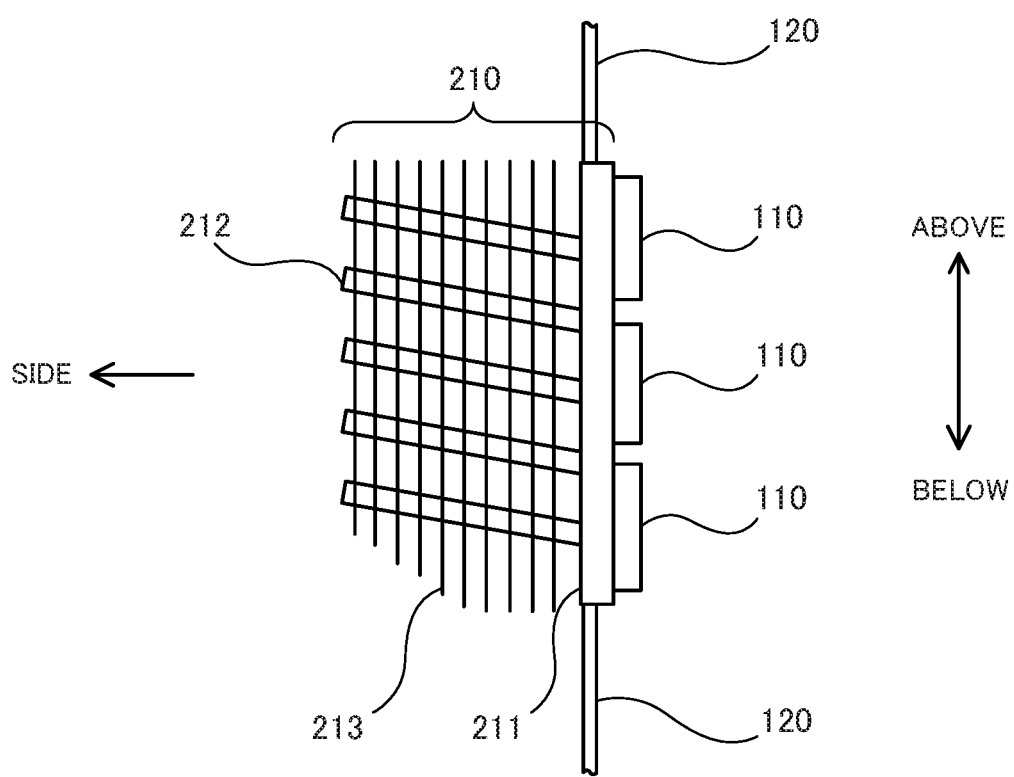

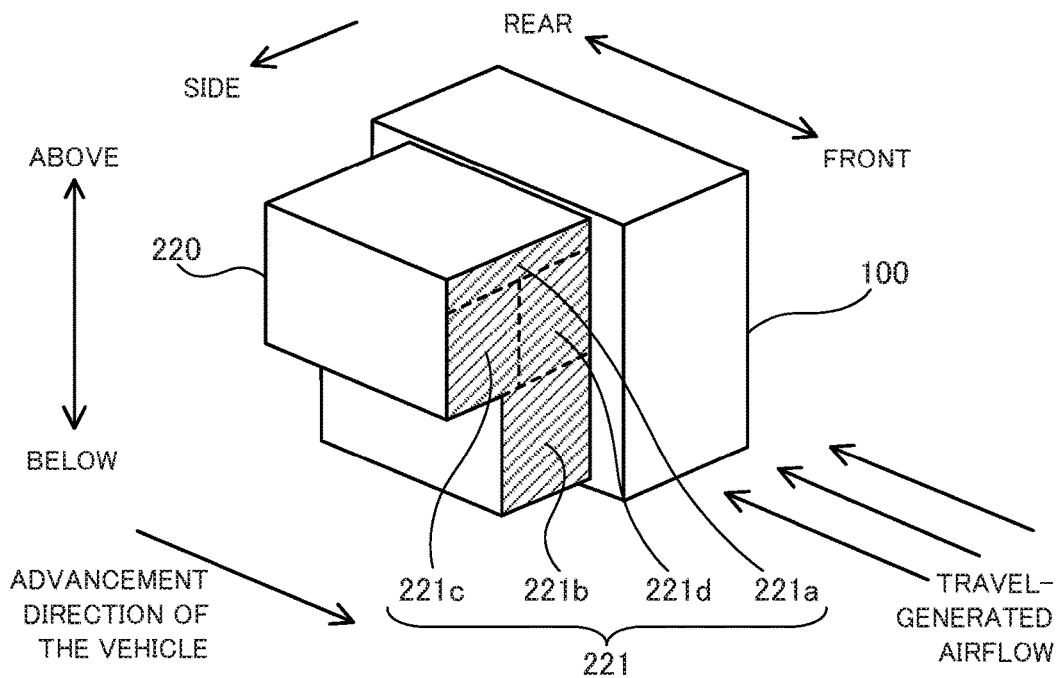
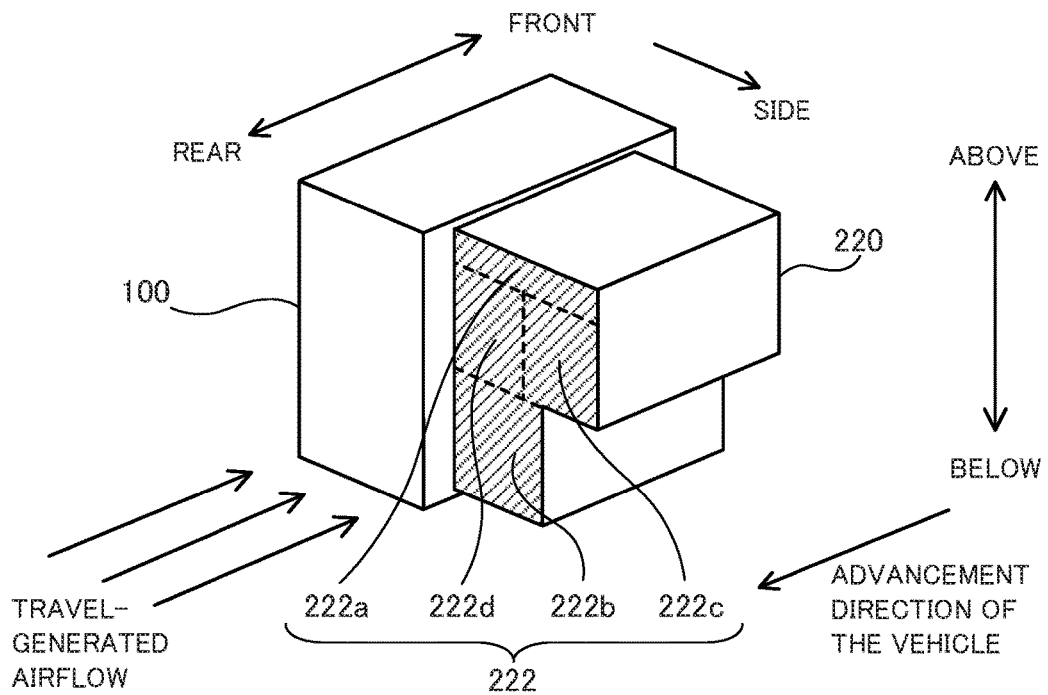

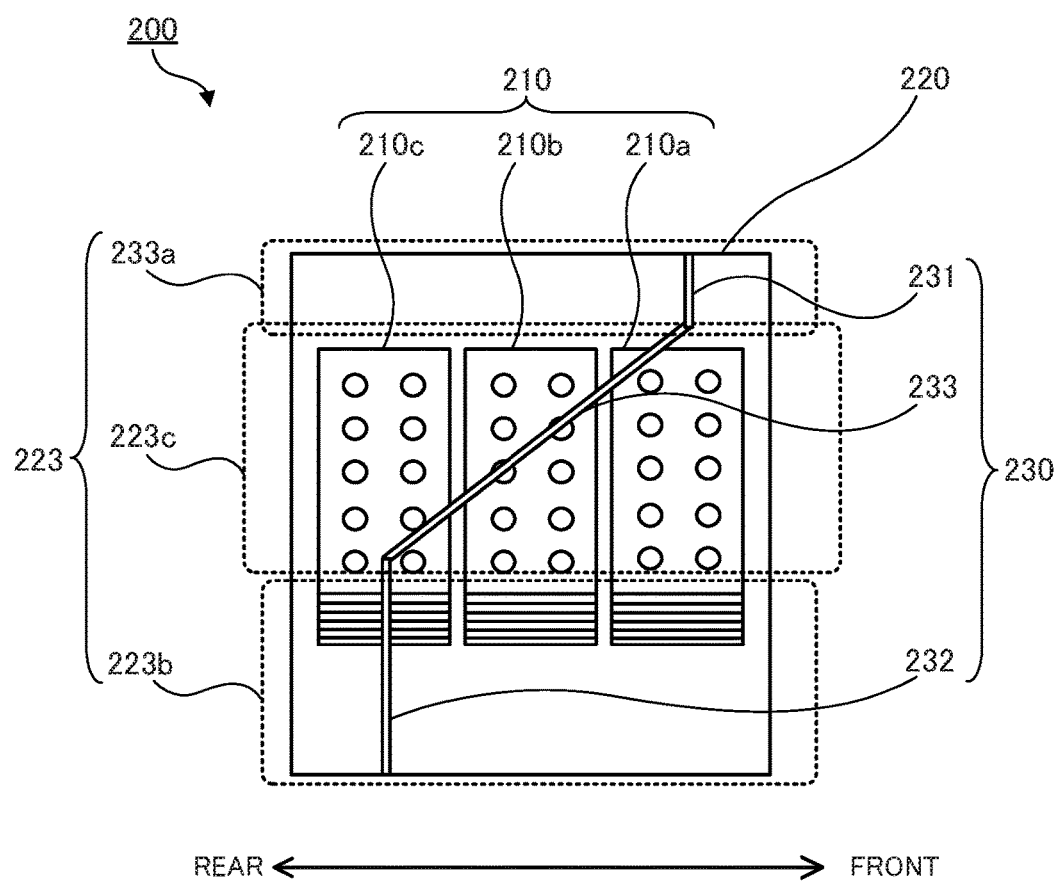

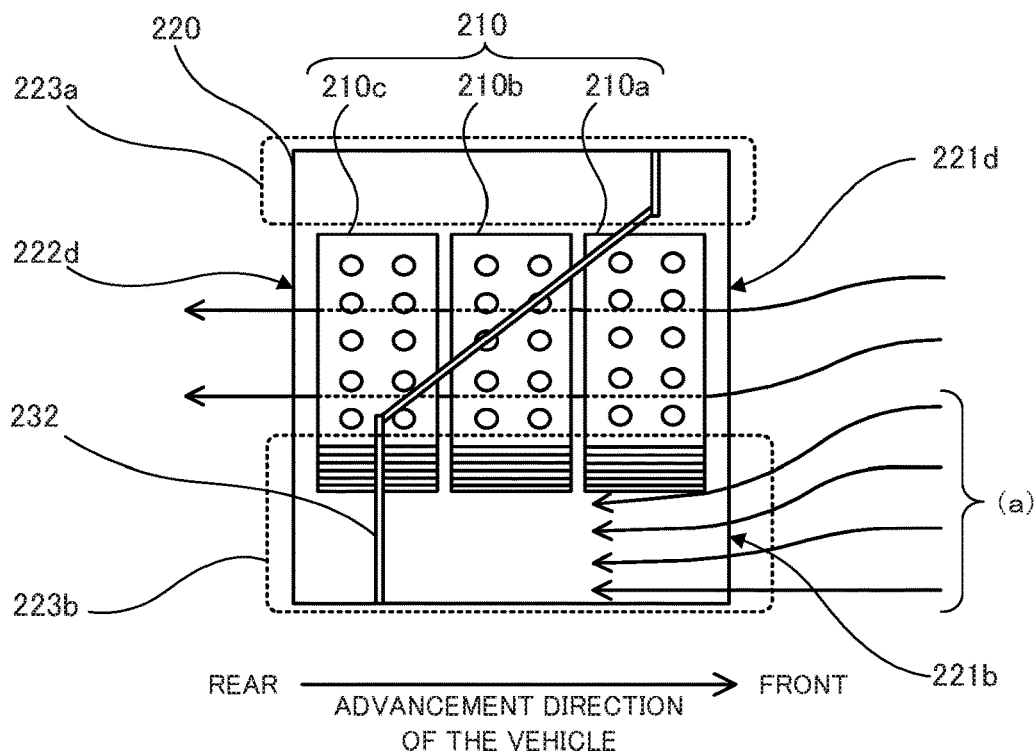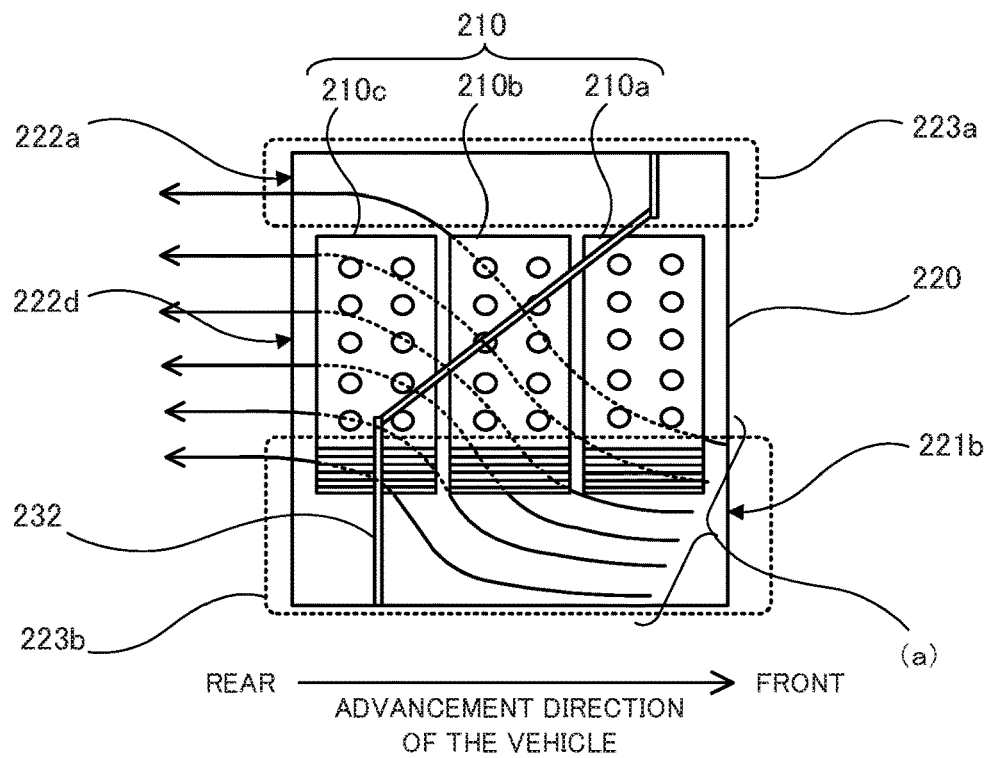

REAR ← ADVANCEMENT DIRECTION OF THE VEHICLE → FRONT

REAR ← ADVANCEMENT DIRECTION OF THE VEHICLE → FRONT

VEHICULAR POWER CONVERSION DEVICE

TECHNICAL FIELD

The present disclosure relates to a vehicular power conversion device.

BACKGROUND ART

Power conversion devices are mounted in railway cars. Power conversion by a power conversion device is performed by a semiconductor that comprises a converter, inverter and the like. The semiconductor generates a large amount of heat due to power conversion. Therefore, typically, a cooling device is attached to a semiconductor that performs power conversion. Patent Literature 1 discloses a cooling device that comprises: coolers that are arranged on the side surface of the semiconductor device and aligned in the advancement direction of the vehicle; and a door for adjusting the amount of travel-generated airflow that is taken in by the coolers.

CITATION LIST

Patent Literature

Unexamined Japanese Patent Application Kokai Publication No. 2001-024124

SUMMARY OF INVENTION

Technical Problem

Travel-generated airflow has the characteristic to flow so as to avoid high-density locations (locations where there is resistance). Therefore, even though coolers are provided so that travel-generated airflow can pass through the inside, the travel-generated airflow flows so as to avoid the locations of the coolers themselves. In the case of a cooling device such as disclosed in Patent Literature 1, travel-generated airflow is not sufficiently taken into the inside of the coolers, so it is not possible to obtain high cooling efficiency.

Moreover, even though the travel-generated airflow is taken into the inside of the coolers, the travel-generated airflow that reaches the later-stage coolers has already been heated by the earlier-stage coolers. In the case of the cooling device disclosed in Patent Literature 1, the travel-generated airflow is not sufficiently cooled by the later-stage coolers, so it is not possible to obtain high cooling efficiency.

Taking into consideration the problems described above, it is an object of the present disclosure to provide a vehicular power conversion device that is able to efficiently cool a semiconductor that performs power conversion.

Solution to Problem

The vehicular power conversion device of the technology of this disclosure is a vehicular power conversion device that includes a semiconductor for converting power. The vehicular power conversion device includes: a plurality of coolers arranged in an array in an advancement direction of a vehicle, and configured to cool the semiconductor; a cooler cover wherein the plurality of coolers is located, and provided with ventilation openings as an intake port and a discharge port for travel-generated airflow; and an airflow-receiving plate located inside the cooler cover. A cavity as a passageway for travel-generated airflow is provided inside the cooler cover, in at least one of above, below or to the side of the plurality of coolers. The ventilation openings are located at least in the advancement direction of the vehicle from the cavity. The airflow-receiving plate that is located in the cavity, when travel-generated airflow flows into the cavity from the ventilation opening, changes the direction of the flow of travel-generated airflow to a direction toward the plurality of coolers.

Advantageous Effects of Invention

With the technology of the present disclosure, at least one cavity is provided above, below or to the side of coolers that cool a semiconductor that converts power, and furthermore, an airflow-receiving plate is provided that changes the flow of travel-generated airflow that enters the cavity to a direction toward the coolers, so the plurality of coolers can be efficiently cooled by the travel-generated airflow. As a result, the semiconductor that performs power conversion can be efficiently cooled.

BRIEF DESCRIPTION OF DRAWINGS

FIG. 1 is a perspective view of a power conversion device according to an embodiment of the present disclosure;

FIG. 2 illustrates a semiconductor device of the power conversion device;

FIG. 4 illustrates a cooler of the cooling device;

FIG. 5 illustrates a cooler cover of the cooling device;

FIG. 6 illustrates the cooler cover of the cooling device;

FIG. 7 illustrates internal construction of the cooling device;

FIG. 10A illustrates the state of travel-generated airflow flowing into a lower cavity from the front of the cooling device;

FIG. 10B illustrates the flow inside the cooling device of travel-generated airflow that flowed into the lower cavity;

DESCRIPTION OF EMBODIMENTS

Figure 3:
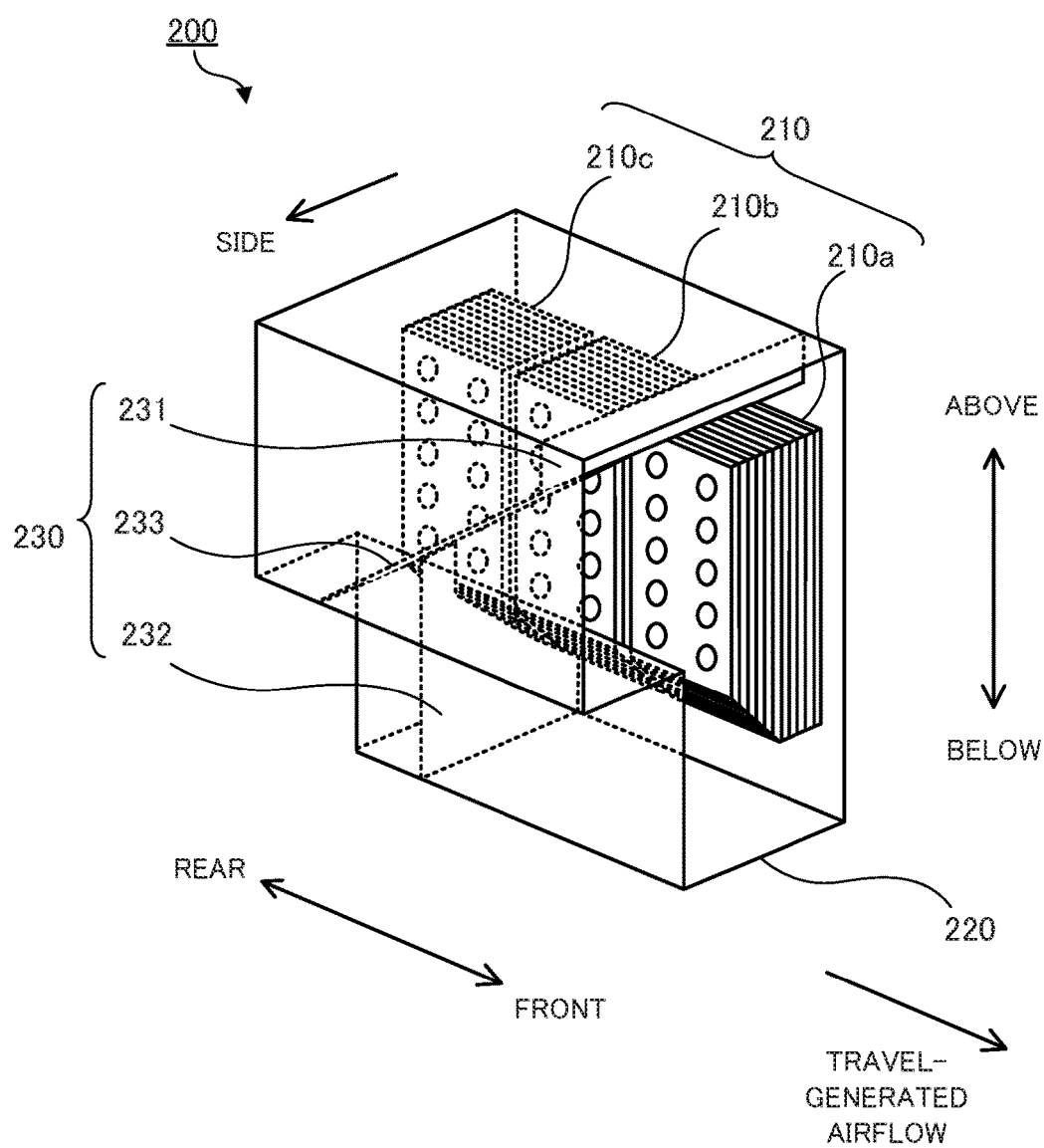
FIG. 3 illustrates a cooling device of the power conversion device.

In the following, an embodiment for embodying the technology of the present disclosure is explained with reference to the drawings. In the drawings, the same reference signs will be used for parts that are identical or equivalent.

The power conversion device 1 according to an embodiment of the present disclosure is a vehicular power conversion device that is mounted in a vehicle such as a train or automobile. Here, a train is a vehicle that travels over a track such as an electric train, diesel train or the like. Trains include trains having plural train cars as well as trains having a single train car. Moreover, trains also include streetcars that travel over road surfaces, monorails that travel on a single rail, tire running trains that travel on a track using rubber tires, and linear motorcars that travel above a track in levitation. In the explanation below, as one example, the power conversion device 1 is presumed to be mounted in a train that can travel back-and-forth, or in other words, a train for which the forward direction and backward direction of the train cars can be reversed.

As illustrated in FIG. 1, the power conversion device 1 comprises a semiconductor device 100 that converts power; and a cooling device 200 that cools the semiconductor device 100. In order to make the following explanation easier to understand one of either the forward direction or the backward direction of the vehicle (advancement direction of the vehicle in FIG. 1) is taken to be the front, and the opposite direction is taken to be the rear, and the side surface direction of the vehicle as seen from a person inside the vehicle is called the side direction (in FIG. 1, the right hand side when facing the front) is called the side.

The semiconductor device 100, as illustrated in FIG. 2, comprises multiple semiconductor elements 110 that convert power, and a frame 120 that protects the semiconductor elements 110 from shock. The semiconductor elements 110 have a power conversion circuit (for example, AC-DC converter, DC-DC converter, inverter) in the inside thereof. The semiconductor elements 110 generate a large amount of heat as the power conversion circuit operates. The semiconductor elements 110 are attached to a heat-receiving plate 211. The heat that is generated by the semiconductor elements 110 is absorbed by the heat-receiving plate 211.

The cooling device 200 is a device for absorbing the heat that is generated by the semiconductor elements 110 and discharging that heat to the outside. The cooling device 200 is located in a location where there is much travel-generated airflow, for example, is located on the surface of the underneath side of the vehicle. The cooling device 200, as illustrated in FIG. 3, comprises multiple coolers 210 that are cooled by the travel-generated airflow, and airflow-receiving plates 230 that are located inside a cooler cover 220.

The cooler 210 is a heat-pipe cooler. The cooler 210 comprises multiple coolers (cooler 210a, cooler 210b, cooler 210c) that are arranged in an array along the advancement direction of the vehicle. Each cooler 210, as illustrated in FIG. 4, comprises a heat-receiving plate 211 that absorbs heat from the semiconductor elements 110, multiple heat pipes 212 that are connected to the heat-receiving plate 211, and multiple heat-radiation fins 213 that are connected to the heat pipes 212.

The heat-receiving plate 211 is a metal plate having high thermal conductivity; for example, is an aluminum plate. The semiconductor elements 110 are attached to the surface of the heat-receiving plate 211. The heat-receiving plate 211 absorbs heat that is generated by the semiconductor elements 111, and transfers that heat to the heat pipes 212.

The heat pipes 212 are pipes that are filled on the inside with a working fluid. The heat pipes 212 are fastened to the heat-receiving plate 211 in a state so as to protrude to the side. The heat pipes 212 are fastened to the heat-receiving plate 211 and are tilted somewhat upward in a state that the working fluid on the inside thereof do not move toward the side according to the incline of the traveling vehicle.

The heat-radiation fins 213 are heat-radiating plates for increasing the thermal conductivity of the heat pipes 212. The heat-radiation fins 213 are fastened to the heat pipes 212 in an arrangement so as to be evenly spaced and parallel with each other, with the flat surfaces thereof facing toward the side. Therefore, the travel-generated airflow is able to move into the coolers 210 from above, below, the front and the rear of the coolers 210.

The cooler cover 220 is a cover that covers the coolers 210. The front and rear of the cooler cover 220, as illustrated in FIG. 5 and FIG. 6, are provided with a ventilation opening 221, and ventilation opening 222. When a vehicle is traveling toward the front, the ventilation opening 221, as illustrated in FIG. 5, functions as an intake port for the travel-generated airflow. The ventilation opening 222 on the opposite side functions as a discharge port for the travel-generated airflow. On the other hand, when the vehicle is traveling toward the rear, the ventilation opening 222, as illustrated in FIG. 6, functions as an intake port for the travel-generated airflow. The ventilation opening 221 on the opposite side functions as a discharge port for the travel-generated airflow.

Figure 8:
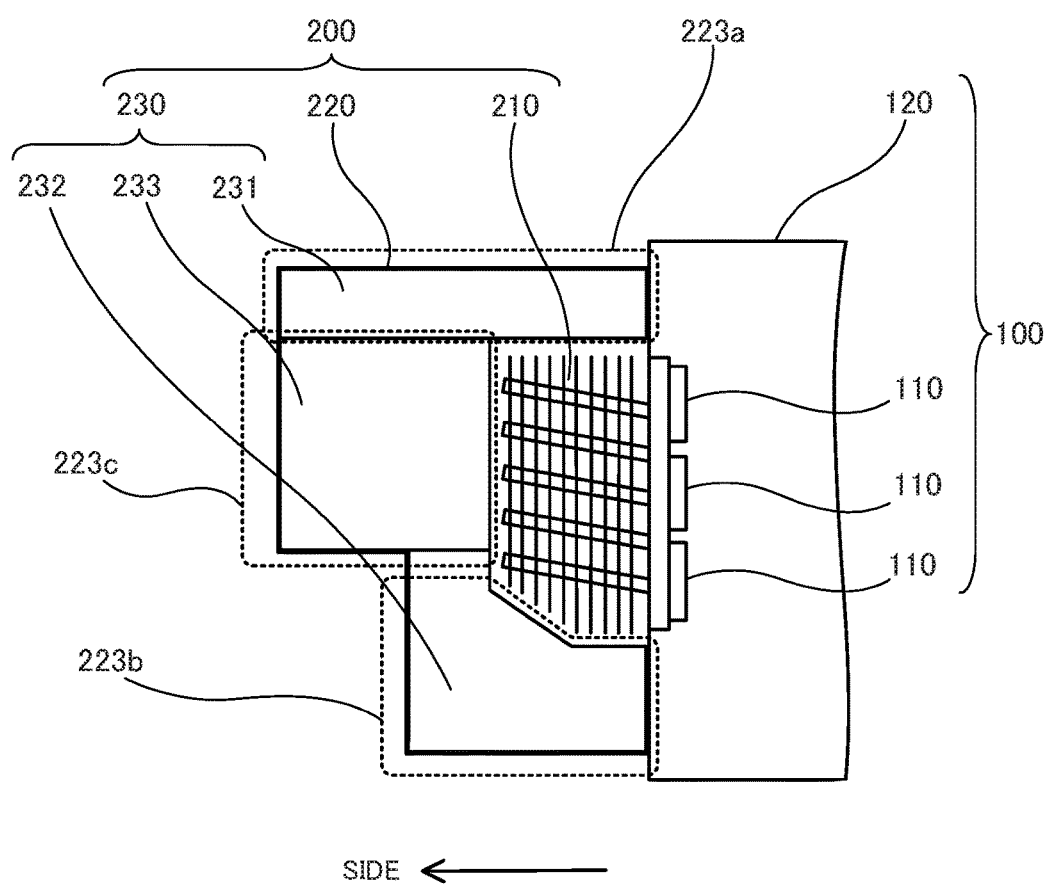
FIG. 8 illustrates internal construction of the cooling device.

As illustrated in FIG. 7 and FIG. 8, coolers 210 are arranged in an array along the advancement direction of the vehicle on the inside of the cooler cover 220. Cavities 223 (upper cavity 223a, lower cavity 223b, side cavity 223c) that act as passageways for the travel-generated airflow are provided above, below and to the side of the coolers 210 respectively. As illustrated in FIG. 5 and FIG. 6, a ventilation opening 221 and a ventilation opening 222 are located at the front and rear of the cavities 223 respectively.

In the explanation below, the ventilation opening 221 at the front of the upper cavity 223a is called the upper ventilation opening 221a, the ventilation opening 221 at the front of the lower cavity 223b is called the lower ventilation opening 221b, the ventilation opening 221 at the front of the side cavity 223c is called the side ventilation opening 221c, and the ventilation opening 221 at the front of the cooler 210 is called the center ventilation opening 221d. Moreover, the ventilation opening 222 at the rear of the upper cavity 223a is called the upper ventilation opening 222a, the ventilation opening 222 at the rear of the lower cavity 223b is called the lower ventilation opening 222b, the ventilation opening 222 at the rear of the side cavity 223c is called the side ventilation opening 222c, and the ventilation opening 222 at the rear of the cooler 210 is called the center ventilation opening 222d.

The airflow-receiving plates 230 are plates that change the travel-generated airflow that flows into the cavities 223 to certain directions toward the coolers 210. The airflow-receiving plates 230, as illustrated in FIG. 7 and FIG. 8, comprise an upper airflow-receiving plate 231 that is located in the upper cavity 223a, a lower airflow-receiving plate 232 that is located in the lower cavity 223*b*, and a side airflow-receiving plate 233 that is located in the side cavity 223*c*.

As illustrated in FIG. 7 and FIG. 8, the upper airflow-receiving plate 231 and the lower airflow-receiving plate 232 are arranged in a state that the flat surfaces thereof face the front and rear. The upper airflow-receiving plate 231 is located above the cooler 210*a* that is the cooler 210 in the final stage when the vehicle is travelling toward the rear. The lower airflow-receiving plate 232 is located below the cooler 210*c* that is the cooler 210 in the final stage when the vehicle is travelling toward the front.

The side airflow-receiving plate 233, as illustrated in FIG. 7, is arranged in a state so as to be inclined with respect to the forward direction of the vehicle. More specifically, the side airflow-receiving plate 233 is arranged in a state that one flat surface faces diagonally toward the lower front, and the other flat surface faces diagonally toward the upper rear. The top end of the side airflow-receiving plate 233, as illustrated in FIG. 8, comes in contact with the upper airflow-receiving plate 231, and the bottom end of the side airflow-receiving plate 233 comes in contact with the lower airflow-receiving plate 232. Therefore, travel-generated airflow that enters into the side cavity 223*c* from the front smoothly flows toward the lower airflow-receiving plate 232, and the travel-generated airflow that enters into the side cavity 223*c* from the rear smoothly flows toward the upper airflow-receiving plate 231.

The cooling operating of the cooling device 200 having this kind of construction is explained below.

As the vehicle travels toward the front, travel-generated airflow enters inside the cooler cover 220 from the ventilation opening 221*c*. When this happens, the travel-generated airflow, as illustrated by (a) in FIG. 9A, enters into the side cavity 223*c* from the side ventilation opening 221*c* while avoiding the location of the coolers 210.

Figure 9A:
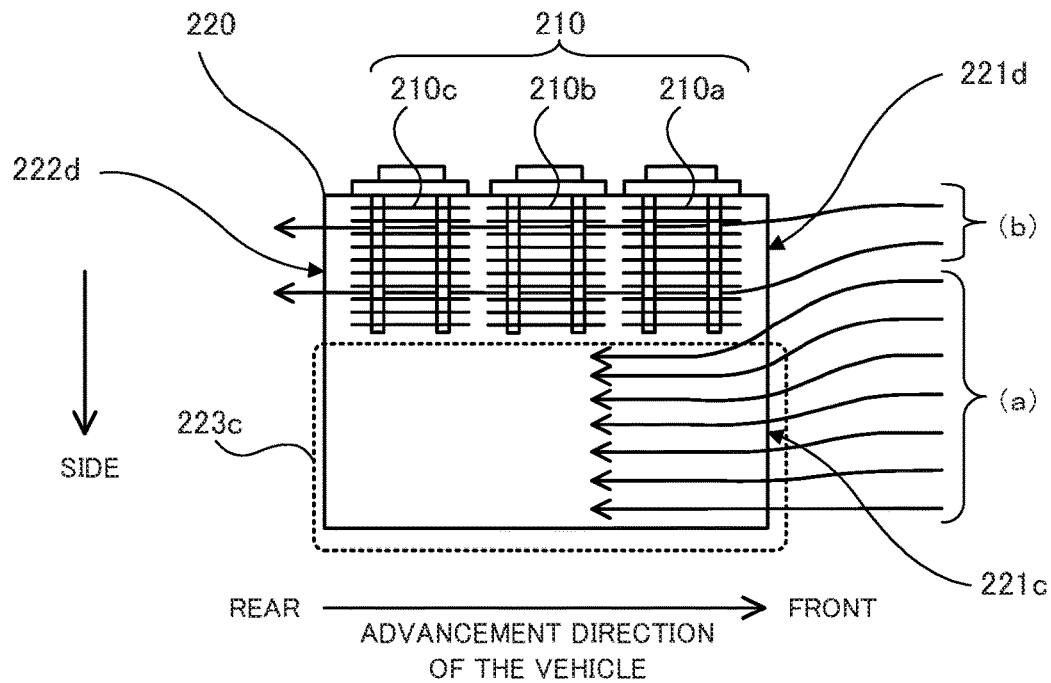
FIG. 9A illustrates the state of travel-generated airflow flowing into a side cavity from the front of the cooling device.

The travel-generated airflow that was unable to avoid the coolers 210, as illustrated by (b) in FIG. 9A, enters inside the cooling cover 220 from the center ventilation opening 221*d*. Then, the travel-generated airflow passes through the inside of the coolers 210 and leaves from the center ventilation opening 222*d*. When this happens, the travel-generated airflow that reaches the later-stage coolers 210 has already been warmed by the prior-stage cooler 210. Therefore, the coolers 210*b*, 210*c* in the later-stage, as illustrated by (b) in FIG. 9A, are not cooled much by the travel-generated airflow.

Figure 9B:
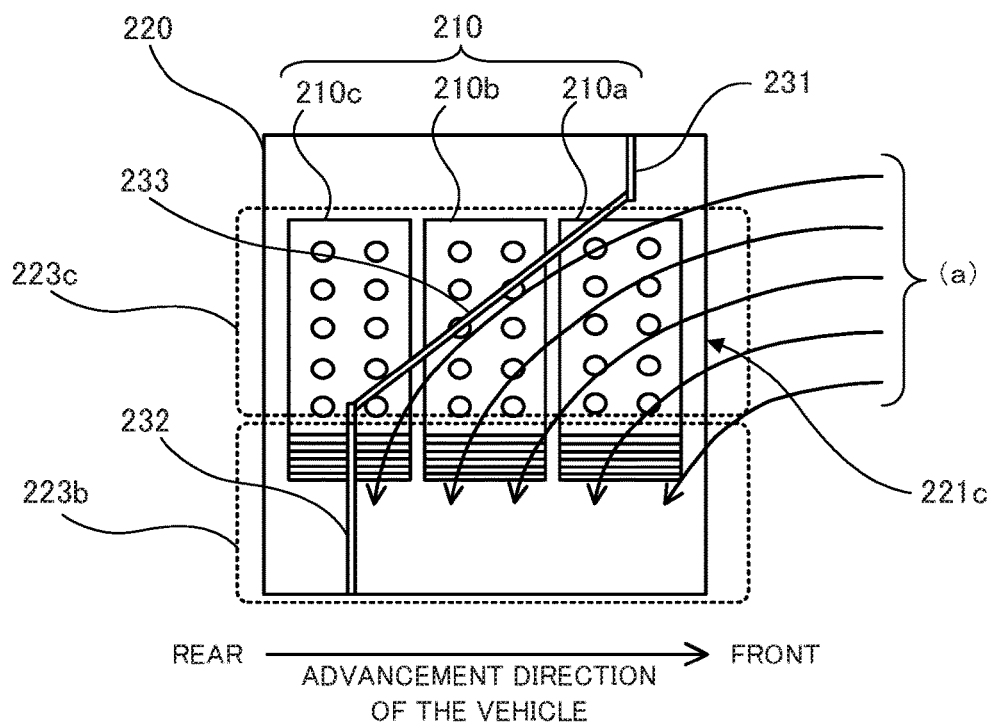
FIG. 9B illustrates the flow inside the cooling device of travel-generated airflow that flowed into the side cavity.
Figure 9C:
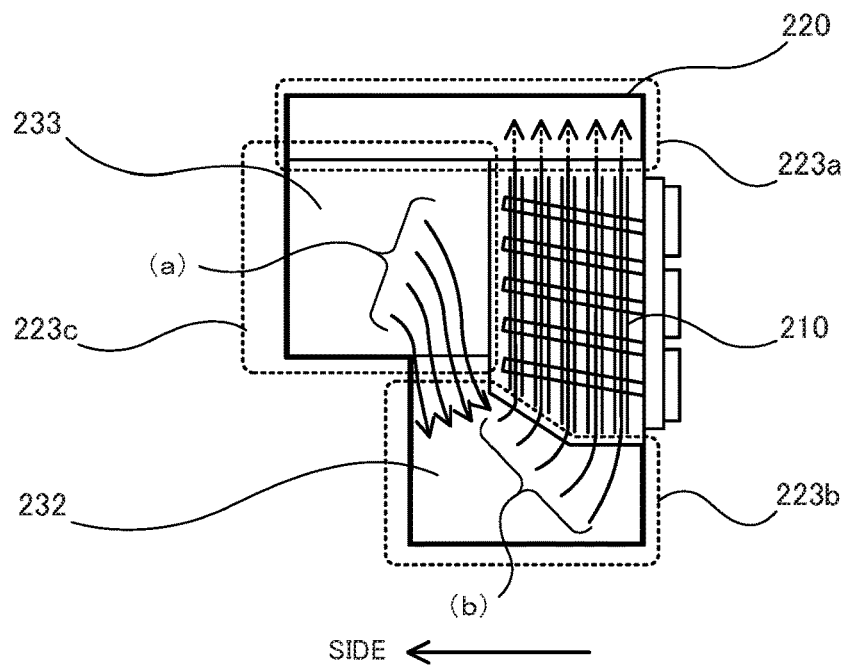
FIG. 9C illustrates the flow inside the cooling device of travel-generated airflow that flowed into the side cavity.

As described above, the side airflow-receiving plate 233 is located in the side cavity 223*c*. The travel-generated airflow that enters into the side cavity 223*c* is blocked by the side airflow-receiving plate 233, and as illustrated by (a) in FIG. 9B and by (a) in FIG. 9C, flows toward the lower cavity 223*b*.

Figure 9D:
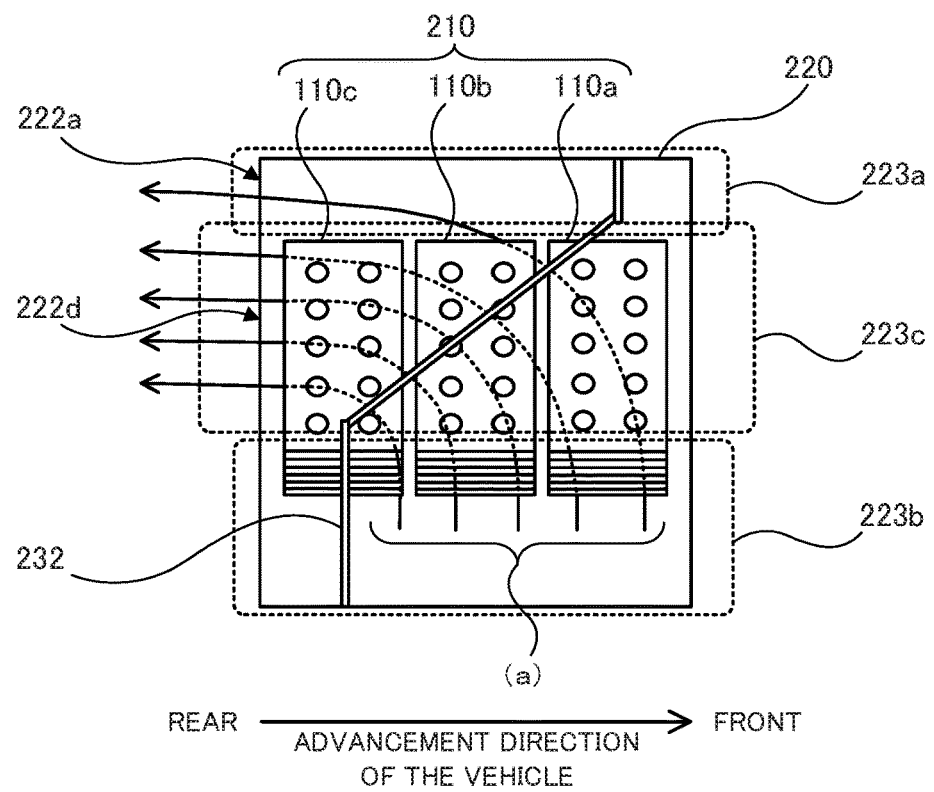
FIG. 9D illustrates the flow inside the cooling device of travel-generated airflow that flowed into the side cavity.

As described above, the lower airflow-receiving plate 232 is located in the lower cavity 223*b*. The travel-generated airflow that enters into the lower cavity 223*b* is blocked by the lower airflow-receiving plate 232, and as illustrated by (b) in FIG. 9C, rises toward the coolers 210. Then, the travel-generated airflow, as illustrated by (a) in FIG. 9D, passes through the inside of the coolers 210, and leaves from the upper ventilation opening 222*a* or center ventilation opening 222*d*.

Moreover, as the vehicle moves toward the front, travel-generated airflow also enters from the lower ventilation opening 221*b*. When this happens, the travel-generated airflow, as illustrated by (a) in FIG. 10A, enters into the lower cavity 223*b* while avoiding the location of the coolers 210. The advancement direction of the travel-generated airflow that enters into the lower cavity 223*b* is changed by the lower airflow-receiving plate 232 to an upward direction. Then, the travel-generated airflow, as illustrated by (a) in FIG. 10B, passes through the inside of the coolers 210 and leaves from the upper ventilation opening 222*a* and the center ventilation opening 222*d*. The lower airflow-receiving plate 232 is located below the cooler 210*c* that is located in the last stage as seen from the front. Therefore, the closer the travel-generated airflow is to the coolers 210 in the later stage, the stronger the airflow is, and cooling is performed well.

On the other hand, as the vehicle travels toward the rear, travel-generated airflow enters inside the cooler cover 220 from the ventilation opening 222*c*. When this happens, the travel-generated airflow, as illustrated by (a) in FIG. 11A, enters into the side cavity 223*c* from the side ventilation opening 222*c*, while avoiding the location of the coolers 210.

Figure 11A:
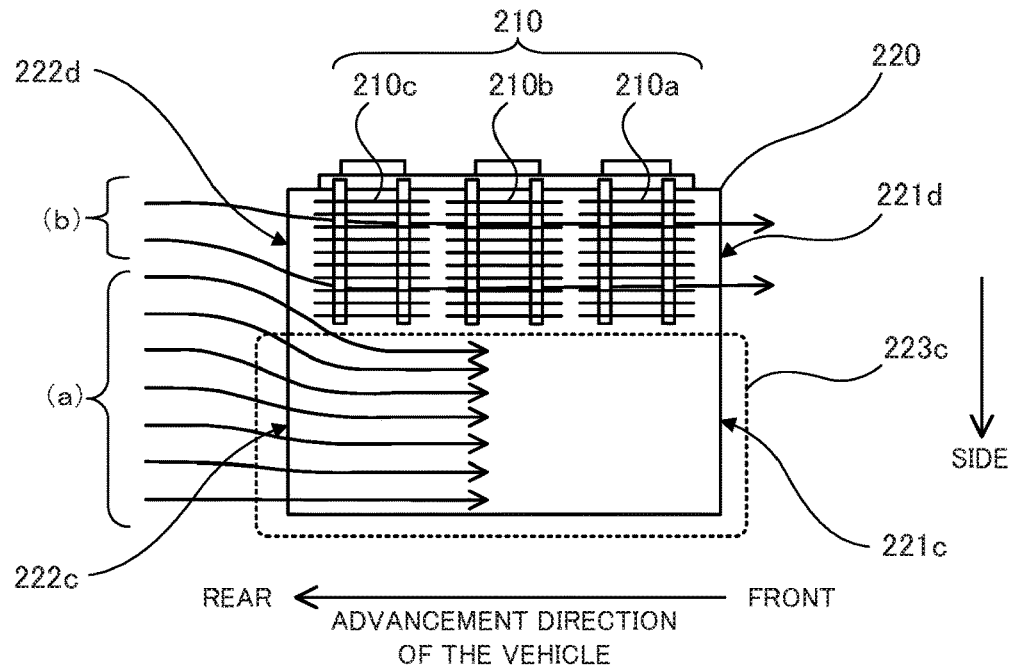
FIG. 11A illustrates the state of travel-generated airflow flowing into the side cavity from the rear of the cooling device.

Travel-generated airflow that could not avoid the coolers 210, as illustrated by (b) in FIG. 11A, enters into the cooler cover 220 from the center ventilation opening 222*d*. Then, the travel-generated airflow passes through the inside of the coolers 210 and leaves from the center ventilation opening 221*d*. When this happens, the travel-generated airflow that reaches the later stage coolers 210 has already been warmed by the earlier stage cooler 210. Therefore, the later-stage coolers 210*b*, 210*a* are not cooled much by the travel-generated airflow as illustrated by (b) in FIG. 11A.

Figure 11B:
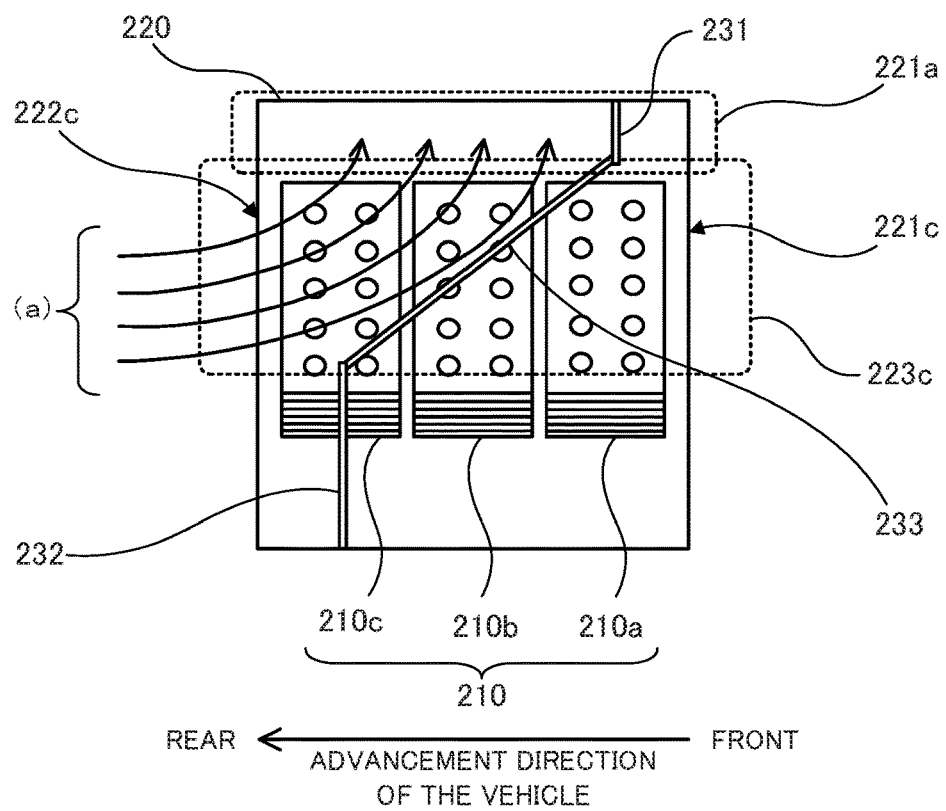
FIG. 11B illustrates the flow inside a cooling device of travel-generated airflow that flowed into the side cavity.
Figure 11C:
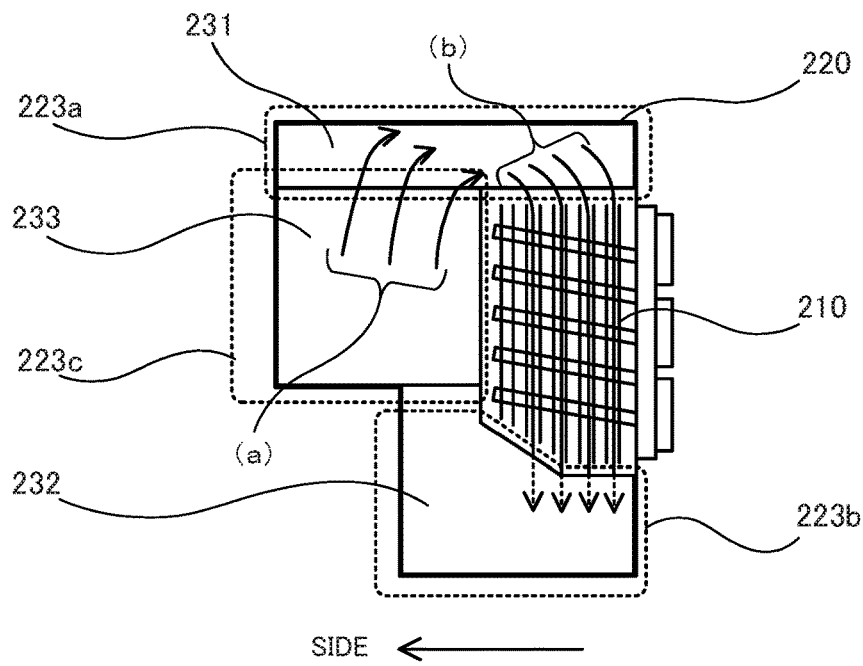
FIG. 11C illustrates the flow inside a cooling device of travel-generated airflow that flowed into a side cavity.
Figure 11D:
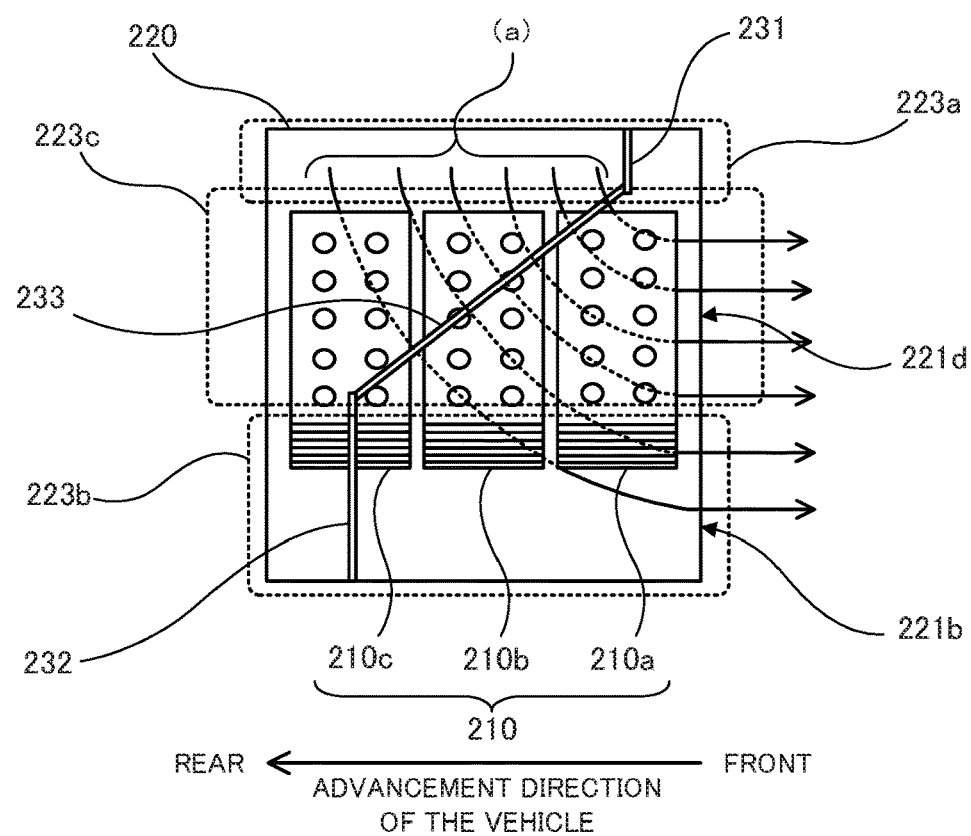
FIG. 11D illustrates the flow inside a cooling device of travel-generated airflow that flowed into a side cavity.

The travel-generated airflow that entered into the side cavity 223*c* is blocked by the side airflow-receiving plate 233, and as illustrated by (a) in FIG. 11B and by (a) in FIG. 11C, flows toward the upper cavity 223*a*. The travel-generated airflow that entered the upper cavity 223*a* is blocked by the upper airflow-receiving plate 231, and as illustrated by (b) in FIG. 11C, drops toward the coolers 210, then, as illustrated by (a) in FIG. 11D, passes through the inside of the coolers 210, and leaves from the lower ventilation opening 221*b* or center ventilation opening 221*d*.

Figure 12A:
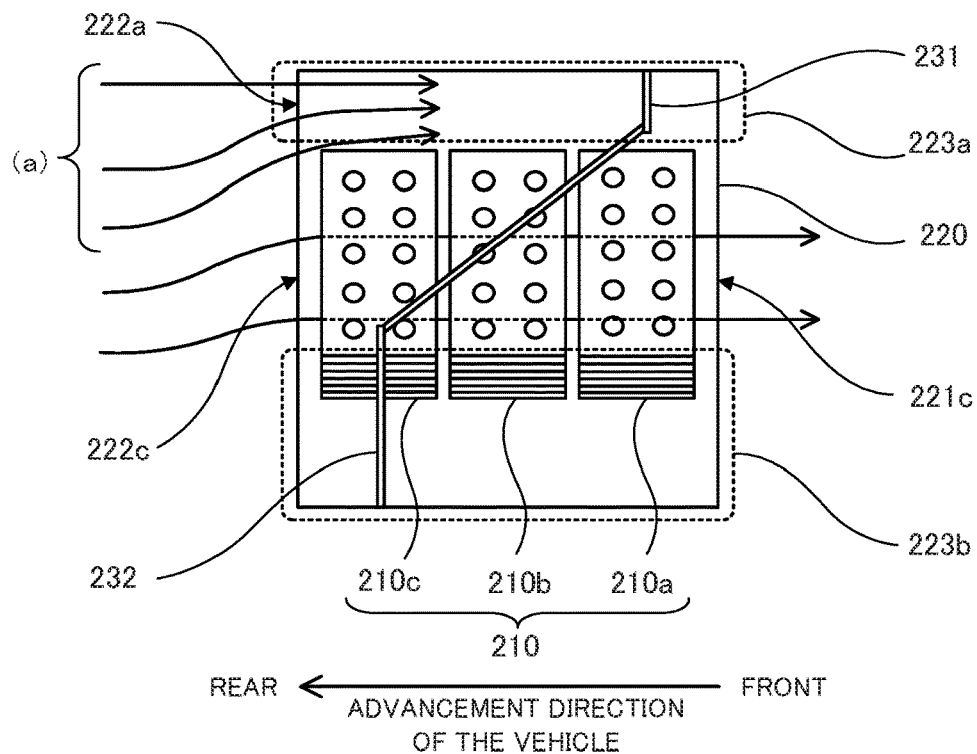
FIG. 12A illustrates the state of travel-generated airflow flowing into an upper cavity from the rear of the cooling device.
Figure 12B:
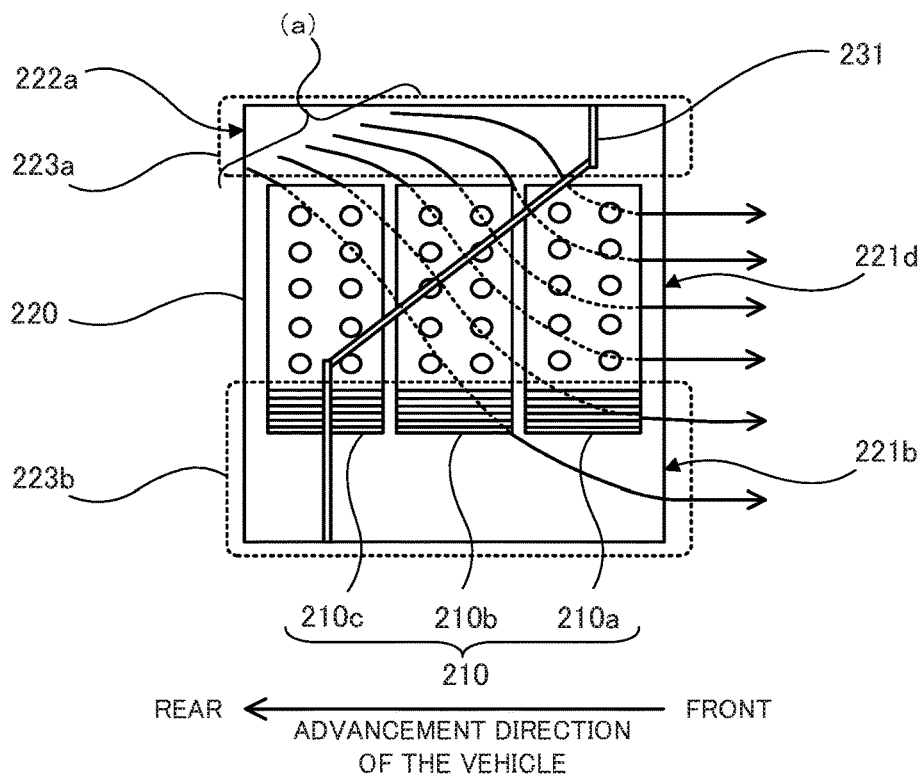
FIG. 12B illustrates the flow inside the cooling device of travel-generated airflow that flowed into the upper cavity.

Moreover, as the vehicle travels toward the rear, travel-generated airflow also enters from the upper ventilation opening 222*a*. The travel-generated airflow, as illustrated by (a) in FIG. 12A, enters into the upper cavity 223*a* while avoiding the location of the coolers 210. The travel-generated airflow that enters into the upper cavity 223*a* is changed to a downward advancement direction by the upper airflow-receiving plate 231. Then, the travel-generated airflow, as illustrated by (a) in FIG. 12B, passes through the inside of the coolers 210, and leaves from the lower ventilation opening 221*b* and center ventilation opening 221*d*. The upper airflow-receiving plate 231 is located below the cooler 210*a* that is in the last stage as seen from the rear. Therefore, the closer the coolers 210 are to the last stage, the stronger the travel-generated airflow is, and the coolers 210 are well cooled.

With this embodiment of the technology of this disclosure, as illustrated in FIG. 7 and FIG. 8, cavities 223 are provided each of above, below and to the side of the coolers 210, and airflow-receiving plates 230 that guide the travel-generated airflow in a direction toward the coolers 210 are provided in each of these cavities 223, so the cooling device 200 can efficiently capture the travel-generated airflow that avoided the coolers 210. In other words, much travel-generated airflow is taken into the inside of the coolers 210, so the coolers 210 are cooled very efficiently. As a result, the cooling device 200 can efficiently cool the semiconductor elements 110.

The airflow-receiving plates 230 are arranged so that the travel-generated airflow that enters into the cavities 233 is caused to enter into the inside of the coolers 210 from above or below the coolers 210. The travel-generated airflow that enters into the inside of the coolers 210 from above or below is not warmed by the early-stage coolers 210, so the later-stage coolers 210 are also efficiently cooled. As a result, the cooling device 200 displays a highly effective cooling function.

Typically, a heat pipe type cooler, as in the case of the cooler 210 illustrated in FIG. 4, has flat plate-shaped heat-radiation fins 213 for increasing the cooling efficiency of the heat pipes 212. Normally, the heat-radiation fins 213 are arranged parallel to each other in a state that the flat surfaces thereof face toward the side. Therefore, the travel-generated airflow that enters into the side cavity 223c illustrated in FIG. 7 and FIG. 8 cannot directly enter inside the coolers 210 from the side of the coolers 210. However, the cooling device 200 of this embodiment is such that the side airflow receiving plate 233 once guides the travel-generated airflow that enters into the side cavity 223c illustrated in FIG. 7 from the side ventilation opening 221c illustrated in FIG. 5 and the side ventilation opening 222c illustrated in FIG. 6 to the upper cavity 223a or lower cavity 223b, and causes the travel-generated airflow to enter inside the coolers 210 from above or below the coolers 210. Therefore, the cooling device 200 is able to not only take in the travel-generated airflow that entered into the upper cavity 223a and lower cavity 223b from the upper ventilation opening 222a and lower ventilation opening 222b, but is also able to efficiently take in travel-generated airflow that flowed into the side cavity 223c illustrated in FIG. 7 from the side ventilation opening 221c illustrated in FIG. 5 and the side ventilation opening 222c illustrated in FIG. 6 into the inside of the coolers 210. As a result, the cooling device 200 is able to display a highly effective cooling function.

The upper airflow-receiving plate 231 and the lower airflow-receiving plate 232 are located above and below the later-stage coolers 210. Therefore, travel-generated airflow that enters into the cavities 223 strongly hits the later-stage coolers 210. In other words, the closer the coolers 210 are to the later stage the better the coolers 210 are cooled by the travel-generated airflow that enters into the cavities 223. On the other hand, coolers 210 in the early stage are cooled well by the travel-generated airflow that entered from the center ventilation opening 221d and the center ventilation opening 222d. As a result, the coolers 210 are uniformly cooled from the early stage to the later stage, so there is no "uneven cooling" of the semiconductor elements 110.

Moreover, the cooling device 200 is provided with ventilation openings (ventilation openings 221, 222) in the front and rear. A side airflow-receiving plate 233 is provided in the side cavity 223c that causes travel-generated airflow to flow into the bottom cavity 223b when travel-generated airflow flows into the side cavity 223c from the ventilation opening 221, and causes travel-generated airflow to flow into the upper cavity 223a when the travel-generated airflow flows into the side cavity 223c from the ventilation opening 222. Moreover, an upper airflow-receiving plate 231 and lower airflow-receiving plate 232 are located in the upper cavity 223a and lower cavity 223b respectively so that the travel-generated airflow that flows in is caused to flow toward the inside of the coolers 210. Therefore, the cooling device 200 is able to take in travel-generated airflow into the inside of the coolers 210 even when the vehicle is traveling toward the front or when traveling toward the rear. As a result, regardless of the direction the vehicle is traveling in, the cooling device 200 is able to display a highly effective cooling function.

Furthermore, the cooling device 200 does not use any moving parts (for example, opening and closing doors as disclosed in Cited Literature 1), so seldom does trouble occur.

The embodiment described above is an example, and it is possible to make various changes and applications.

For example, in the embodiment above, the number of coolers 210 located in the cooling device 200 was three; however, the number of coolers could be two, or could be four or more.

Figure 13:
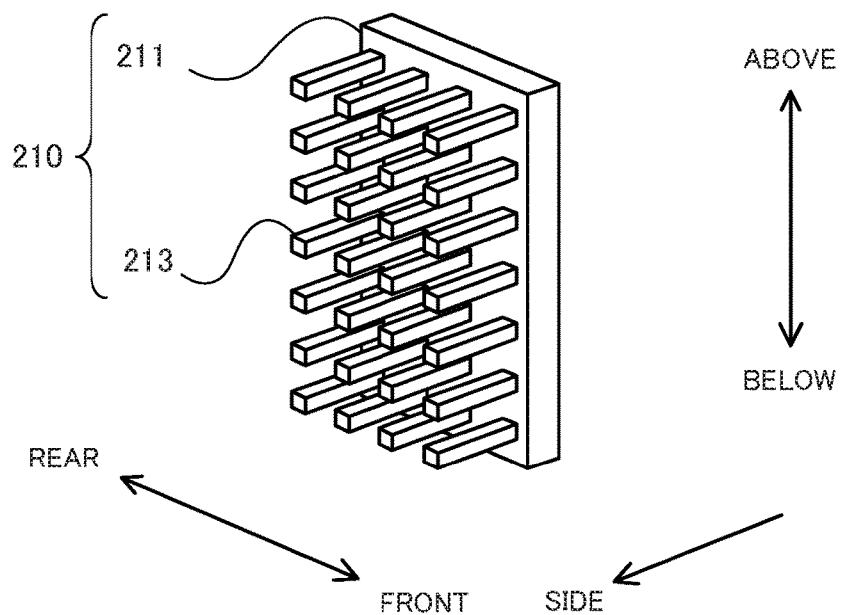
FIG. 13 illustrates a variation of a cooler.

Moreover, the coolers 210 are not limited to coolers having the construction described in the embodiment above. For example, the coolers 210, as illustrated in FIG. 13, can be such that plural rod shaped heat-radiation fins 213 stand close together facing toward the side from the heat-receiving plate 211. By using this kind of shape, it is possible for travel-generated airflow to enter into the inside of the coolers 210 from the side not only from the front, rear, above and below.

Figure 14:
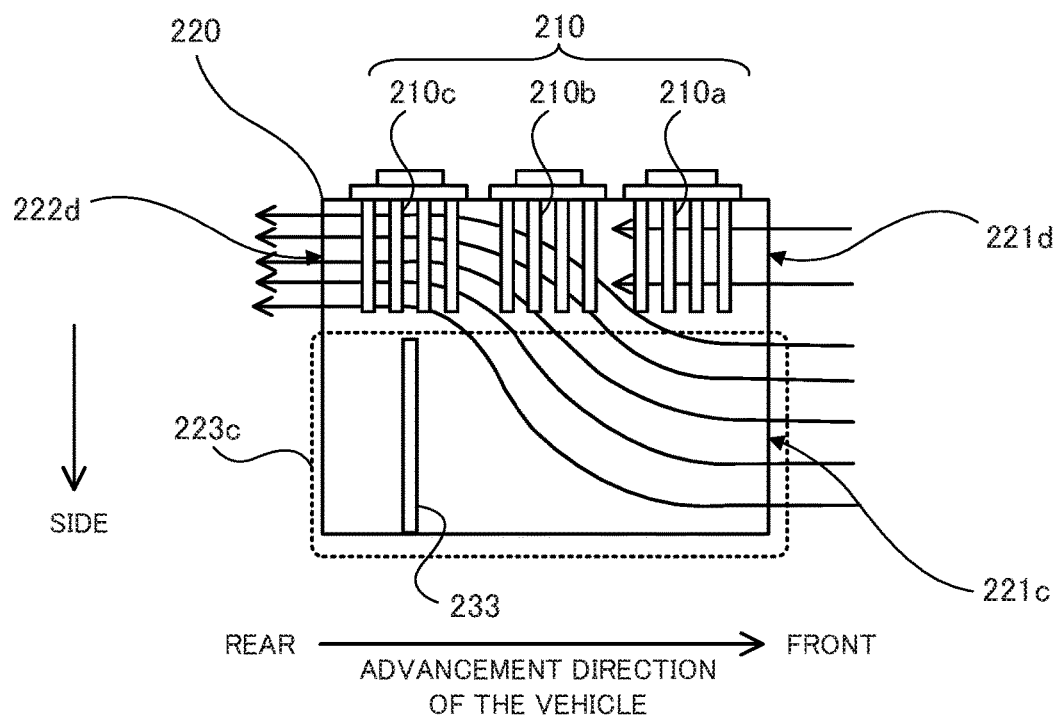
FIG. 14 illustrates a variation of a cooling device.
Figure 15:
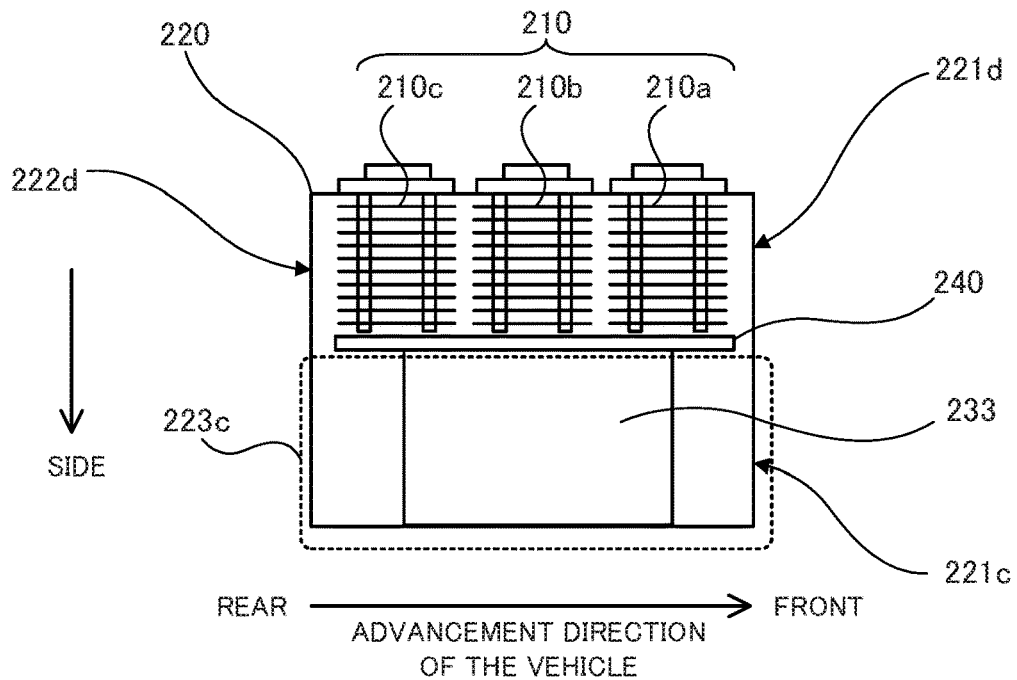
FIG. 15 illustrates the state of a partitioning plate located between the side cavity and coolers.

When using coolers 210 into which travel-generated airflow can also enter from the side, the side airflow-receiving plate 233 can be arranged in the side cavity 223c such that the flat surfaces face the front and rear. Here, as illustrated in FIG. 14, the side airflow-receiving plate 233 can be arranged on the side of the cooler 210 located in the last stage, or in other words, on the side of cooler 210c.

Furthermore, in the embodiments above, cavities 223 (upper cavity 223a, lower cavity 223b, side cavity 223c) were provided in three directions, above, below and to the side of the coolers 210; however, the cavities 223 do not necessarily have to be provided in all three directions. The cavity 223, for example, could be any one of the upper cavity 223a, lower cavity 223b, and side cavity 223c. Moreover, the cavities 223 could also be any two of the upper cavity 223a, lower cavity 223b, and side cavity 223c.

It is also possible to arrange a partitioning plate 240 inside the cooler cover 220 so as to partition the space where the coolers 210 are located and the side cavity 223c. The partitioning plate 240 can be arranged in a state that the flat surfaces thereof face toward the side. In that case, the side airflow-receiving plate 233 can be arranged in a state that one of edge sides comes in contact with a flat surface of the partitioning plate 240 so that travel-generated airflow that enters into the side cavity 223c does not escape to the rear or front from the space between the side airflow-receiving plate 233 and the coolers 210. Travel-generated airflow can be surely guided from the side cavity 223c to the lower cavity 223b, so it is possible to increase the cooling efficiency of the cooling device 200.

Figure 16:
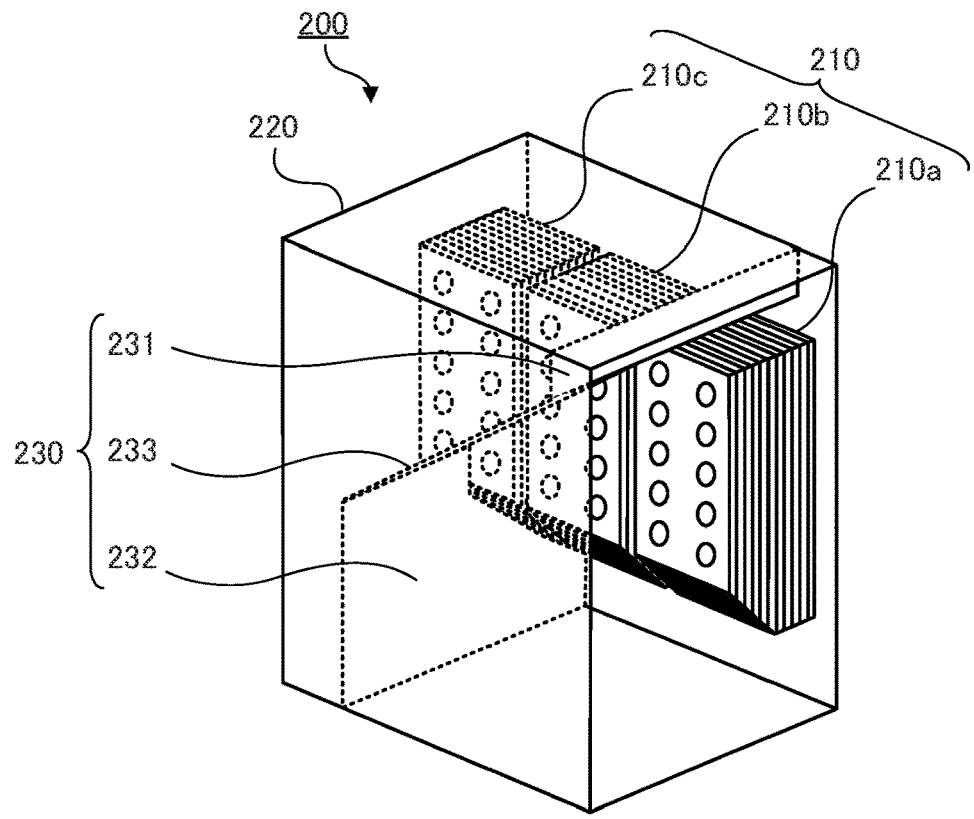
FIG. 16 illustrates a cooling device in which a cavity is provided underneath a side cavity.

In the embodiment described above, a cavity was not provided below the side cavity 223c (to the side of the lower cavity 223b); however, as illustrated in FIG. 16, it is also possible to provide a cavity below the side cavity 223c (to the side of the low cavity 223b). Travel-generated airflow can be smoothly guided from the side cavity 223c to the lower cavity 223b, so it is possible to increase the cooling efficiency of the cooling device 200.

Moreover, it is also possible to provide net-shaped members such as wire mesh or the like in the ventilation opening 221 and ventilation opening 222. This makes it possible to prevent foreign matter from getting inside the cooler cover 220 while still being able to take travel-generated airflow into the inside of the cooler cover 220.

In the embodiment described above, the semiconductor device 100 has a frame 120 that covers the semiconductor elements 110; however, it is not absolutely necessary for the semiconductor device 100 to have a frame 120. The semiconductor elements 110 can be placed directly inside the vehicle. In that case, the cooling device 200 can be directly attached to the side or the like of the vehicle.

Furthermore, in the embodiment described above, the power conversion device 1 is mounted in a train that is capable of inverting in both the forward direction and backward direction; however, the power conversion device 1 can also be mounted in a train that is capable of traveling in only one direction. The vehicle in which the power conversion device 1 is mounted is not limited to being a train, and can also be an automobile such as a bus, truck and the like.

The foregoing describes an example embodiment for explanatory purposes. Although the foregoing discussion has presented a specific embodiment, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Power conversion device
100 Semiconductor device
110 Semiconductor element
120 Frame
200 Cooling device
210, 210a, 210b, 210c Cooler
211 Heat-receiving plate
212 Heat pipe
213 Heat-radiation fin
220 Cooler cover
221, 222 Ventilation openings
221a, 222a Upper ventilation opening
221b, 222b Lower ventilation opening
221c, 222c Side ventilation opening
221d, 222d Center ventilation opening
223 Cavity
223a Upper cavity
223b Lower cavity
223c Side cavity
230 Airflow-receiving plate
231 Upper airflow-receiving plate
232 Lower airflow-receiving plate
233 Side airflow-receiving plate
240 Partitioning plate

The invention claimed is:

1. A vehicular power conversion device including a semiconductor for converting power, comprising:
a plurality of coolers arranged in an array in an advancement direction of a vehicle, and configured to cool the semiconductor;
a cooler cover wherein the plurality of coolers is located, and provided with ventilation openings serving as an intake port and a discharge port for travel-generated airflow; wherein
the following are provided inside the cooler cover:
at least one of (i) an upper cavity located above the plurality of coolers as a passageway for travel-generated airflow or (ii) a lower cavity located below the plurality of coolers as a passageway for travel-generated airflow, and a side cavity located at a side of the plurality of coolers as a passageway for travel-generated airflow; and
the ventilation openings are located in the advancement direction of the vehicle in: (i) at least one of the upper cavity or the lower cavity, and (ii) the side cavity;
an airflow-receiving plate located in the side cavity and tilted relative to the advancement direction of the vehicle, and when the travel-generated airflow flows into the side cavity, the travel-generated airflow then flows into the upper cavity or lower cavity; and
an airflow-receiving plate located in the upper cavity or the lower cavity directs the travel-generated airflow flowing therein into an inside of the plurality of coolers from thereabove or therebelow.

2. The vehicular power conversion device according to claim 1, wherein
the plurality of coolers has a heat pipe, and flat plate-shaped heat-radiation fins that are fastened to the heat pipe in a state that the flat surfaces thereof are arranged parallel to each other and facing toward the side.

3. The vehicular power conversion device according to claim 1, wherein
ventilation openings, in addition to the ventilation openings in the advancement direction of the vehicle from the at least one of the upper cavity or the lower cavity and from the side cavity, are also located in the advancement direction of the vehicle from the plurality of coolers;
the plurality of coolers is formed so that travel-generated airflow can enter inside even from the advancement direction of the vehicle; and
the airflow-receiving plate that is located in the upper cavity, the lower cavity or the side cavity is located in the upper, lower or side part of the cooler in the last stage of the plurality of coolers.

4. The vehicular power conversion device according to claim 1, wherein
the upper cavity, the lower cavity and the side cavity are provided inside the cooler cover;
the airflow-receiving plates are located respectively in the upper cavity, the lower cavity and the side cavity;
the ventilation openings are located in the advancement direction of the vehicle from the side cavity and in the opposite direction from the advancement direction from the side cavity respectively;
the airflow-receiving plate that is located in the side cavity, when travel-generated airflow flows into the side cavity from one of the ventilation opening in the vehicle advancement direction or the ventilation opening in the opposite direction, causes the travel-generated airflow to flow into one of the upper cavity or lower cavity, and when travel-generated airflow flows into the side cavity from the other ventilation opening, causes the travel-generated airflow to flow into the other cavity; and
the airflow-receiving plates that are located in the upper cavity and in the lower cavity cause travel-generated airflow that flows from the side cavity to flow from above and below the plurality of coolers respectively toward the inside of the plurality of coolers.

5. The vehicular power conversion device according to claim 1, wherein a partitioning plate that is configured to partition the plurality of coolers from the side cavity is located inside the cooler cover;

the partitioning plate is located in a state that the flat surfaces thereof face toward the side; and the airflow-receiving plate that is located in the side cavity is located in a state that one of edge sides thereof comes in contact with a flat surface of the partitioning plate.

6. The vehicular power conversion device according to claim 1, wherein the plurality of coolers comprises rod-shaped heat-radiation fins located close together and facing toward the side.

7. The vehicular power conversion device according to claim 1, wherein, for the airflow-receiving plate that is located in the at least one of the upper cavity or the lower cavity, an edge portion of the airflow-receiving plate in a side direction is located further in the side direction than an edge portion of the plurality of coolers.

8. The vehicular power conversion device according to claim 1, wherein a side-direction edge portion of the at least one of the upper cavity or the lower cavity is located to align with a side-direction edge portion of the side cavity.

9. The vehicular power conversion device according to claim 1, wherein a side-direction edge portion of the airflow-receiving plate that is located in the at least one of the upper cavity or the lower cavity is located to align with a side-direction edge portion of the airflow-receiving plate that is located in the side cavity.

10. A vehicular power conversion device including a semiconductor for converting power, comprising:

a plurality of coolers arranged in an array in an advancement direction of a vehicle, and configured to cool the semiconductor;

a cooler cover wherein the plurality of coolers is located, and provided with ventilation openings serving as an intake port and a discharge port for travel-generated airflow;

wherein the following are provided inside the cooler cover: at least one of (i) an upper cavity located above the plurality of coolers as a passageway for travel-generated airflow or (ii) a lower cavity located below the plurality of coolers as a passageway for travel-generated airflow, and a side cavity located at a side of the plurality of coolers as a passageway for travel-generated airflow, wherein if the upper cavity is provided, the upper cavity extends to above the side cavity, and the upper cavity and the side cavity communicate with each other above the side cavity;

if the lower cavity is provided, the lower cavity extends to below the side cavity, and the lower cavity and the side cavity communicate with each other below the side cavity;

the ventilation openings are located at least in the advancement direction of the vehicle in: (i) at least one of the upper cavity or the lower cavity, and (ii) the side cavity; and an airflow-receiving plate located in and extending along the side cavity and the at least one of the upper cavity or the lower cavity, and directs the travel-generated airflow flow that enters the at least one of the upper cavity or the lower cavity toward the plurality of coolers.

* * * * *